US011769858B2

(12) United States Patent
Cui et al.

(10) Patent No.: US 11,769,858 B2
(45) Date of Patent: *Sep. 26, 2023

(54) LIGHT EMITTING DEVICE AND METHOD OF MAKING THE SAME

(71) Applicant: The Boeing Company, Chicago, IL (US)

(72) Inventors: Shanying Cui, Calabasas, CA (US); Danny Kim, Agoura Hills, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,302

(22) Filed: Feb. 8, 2022

(65) Prior Publication Data
US 2022/0158032 A1    May 19, 2022

Related U.S. Application Data

(63) Continuation of application No. 16/822,512, filed on Mar. 18, 2020, now Pat. No. 11,271,138.

(51) Int. Cl.
*H01L 33/00* (2010.01)
*H01L 33/24* (2010.01)
(Continued)

(52) U.S. Cl.
CPC .......... *H01L 33/24* (2013.01); *H01L 33/0075* (2013.01); *H01L 33/06* (2013.01); *H01L 33/32* (2013.01)

(58) Field of Classification Search
CPC ..... H01L 33/24; H01L 33/0075; H01L 33/06; H01L 33/32
See application file for complete search history.

(56) References Cited

U.S. PATENT DOCUMENTS 8,686,396 B2    4/2014    Khan
8,890,184 B2    11/2014   Kim et al.
(Continued)

FOREIGN PATENT DOCUMENTS

WO    2005031881 A2    4/2005

OTHER PUBLICATIONS

Muramoto et al., "Development and future of ultraviolet light-emitting diodes: UV-LED will replace the UV lamp", 2014, Semicond. Sci. Technol., 29 (2014) 084004, pp. 1-8; published Jun. 6, 2014.*

(Continued)

*Primary Examiner* — Nikolay K Yushin
(74) *Attorney, Agent, or Firm* — MH2 Technology Law Group LLP (57) ABSTRACT

A light emitting device for emitting UVC radiation. The device comprises a substrate and a patterned layer. The patterned layer comprises a plurality of mask regions on the substrate. Exposed portions of the substrate are disposed between the mask regions. A plurality of nanostructures are disposed on the exposed portions of the substrate and over the mask regions, the plurality of nanostructures being a single crystal semiconductor and comprising a core tip. An active layer is disposed over the plurality of nanostructures. The active layer is a quantum well structure and comprises at least one material chosen from AlN, AlGaN and GaN. A p-doped layer is disposed over the active layer. Both the active layer and the p-doped layer are conformal to the plurality of nanostructures so as to form an emitter tip over the core tip.

34 Claims, 4 Drawing Sheets

(51) Int. Cl.
*H01L 33/06* (2010.01)
*H01L 33/32* (2010.01)

(56) References Cited

U.S. PATENT DOCUMENTS

| | | | |
|---|---|---|---|
| 9,406,839 | B2 | 8/2016 | Kim et al. |
| 9,705,030 | B2 | 7/2017 | Kneissl et al. |
| 10,079,331 | B2 | 9/2018 | Herner et al. |
| 2010/0213436 | A1 | 8/2010 | Khan |
| 2013/0015477 | A1 | 1/2013 | Kim et al. |
| 2013/0277642 | A1 | 10/2013 | Kneissl et al. |
| 2013/0313514 | A1* | 11/2013 | Hwang .................. H01L 33/16 977/762 |
| 2018/0204977 | A1 | 7/2018 | Dheeraj et al. |

OTHER PUBLICATIONS

Akaike et al., "AlxGa1-xN-based semipolar deep ultraviolet light-emitting diodes", 2018, Applied Physics Express 11, 061001 (pp. 1-061001-01-061001-04), published May 18, 2018.*

Shatalov et al., "Deep ultraviolet semiconductor light sources for sensing and security", 2009, Proc. of SPIE vol. 7484, 74840C-11-7484C-11, published Sep. 2009.*

Simon et al., "Polarization-Induced Hole Doping in Wide-Band-Gap Uniaxial Semiconductor Heterostructures", 2010, Science vol. 237 pp. 60-62, published Jan. 1, 2020.*

Liu et al., "Molecular beam epitaxial growth and characterization of AlN nanowall deep UV light emitting diodes," Appl. Phys. Lett. 111, 101103 (2017).

Liu et al., "Selective area epitaxy of AlGaN nanowire arrays across nearly the entire compositional range for deep ultraviolet photonics," Optics Express, vo. 25, No. 24, Nov. 27, 2017, 9 pages.

Nami et al., "Carrier Dynamics and Electro-Optical Characterization of High-Performance GaN/InGaN Core-Shell Nanowire Light-Emitting Diodes," Scientific Reports, (2018), pp. 1-11.

Extended European Search Report dated Aug. 10, 2021 in corresponding European Applicaton No. 21160705.6, 8 pages.

Moore et al., "Use of UV-C radiation to disinfect non-critical patient care items: a laboratory assessment of the Nanoclave Cabinet," 2012 BMC Infectious Diseases 2012,12:174, pp. 1-9, Published: Aug. 3, 2012 (Year: 2012).

* cited by examiner

LIGHT EMITTING DEVICE AND METHOD OF MAKING THE SAME

RELATED APPLICATIONS

This application is a continuation of U.S. patent application Ser. No. 16/822,512, filed on Mar. 18, 2020, now U.S. Pat. No. 11,271,138, the disclosure of which is incorporated herein by reference in its entirety.

FIELD OF THE DISCLOSURE

The present disclosure is directed to a device for emitting light, and in particular, a device for emitting light in the UVC spectrum.

BACKGROUND

LED devices emitting radiation in the UVC band have a variety of potential commercial applications. However, such UVC LED devices are not generally commercially available due to low wall plug efficiency. Prior experimental UVC LED devices also have disadvantages with respect to poor external quantum efficiency. This is particularly true for LEDs emitting wavelengths shorter than 250 nm. Further, most LED devices have an output emission wavelength (e.g., usually longer than 300 nm) that is too long for short-wavelength UVC applications. Further, many LED devices use InGaN as an active material, which does not emit light in the UVC range of wavelengths, but instead emits light in the visible spectrum.

A known method for forming UVC LED devices includes using nanometer scale selective-area epitaxy with circular apertures to grow vertically oriented nanowires. An optically active AlGaN layer is then deposited mid-way and then finally capped with further material for doping and surface passivation. X .Liu et al, *Optics Express* 25, 30494 2017. In Liu et al., the authors are able to demonstrate emission across the entire c-band with good internal quantum efficiency owing partly to the core shell structure that reduces non-radiative recombination. A main achievement here is using nanowires to relieve strain to allow for large Al-content active layers in order to reach the shorter wavelengths. However the reduced strain comes at the cost of reduced area fraction of the emitter layer. Also, these layers are still nominally aligned along the c-plane, so issues of reduced oscillator strength and TM polarized emission still remain.

Other methods for making UVC LED devices employ etching techniques to define the growth areas, as described by X. Liu et al, *Appl. Phys. Lett.* 2017. AlGaN is grown on the side walls of GaN vertical fins, an array of which are formed via dry etching. The dry-etching causes surface damage and necessitates a wet-etch step. The growth on these fins addresses issues with TM polarized output, where the authors state that more TM polarized light can be extracted from these structures due to the vertical orientation of the fins. However these fins are spaced apart by about 2 um, severely reducing the area fraction of the emitters and limiting the maximum achievable brightness. Further, this minimum width between fins is required for material to infiltrate to the base.

Thus, there is a need in the art for LED structures and processes that can provide more efficient LEDs capable of emitting in the UVC spectrum.

SUMMARY

The present disclosure is directed to a light emitting device for emitting UVC radiation. The device comprises a substrate and a patterned layer. The patterned layer comprises a plurality of mask regions on the substrate. Exposed portions of the substrate are disposed between the mask regions. A plurality of nanostructures are disposed on the exposed portions of the substrate and over the mask regions, the plurality of nanostructures being a single crystal semiconductor and comprising a core tip. An active layer is disposed over the plurality of nanostructures. The active layer is a quantum well structure and comprises at least one material chosen from AlN, AlGaN and GaN. A p-doped layer is disposed over the active layer. Both the active layer and the p-doped layer are conformal to the plurality of nanostructures so as to form an emitter tip over the core tip.

The present disclosure is also directed to a method of making a UVC light emitting device. The method comprises forming a patterned layer comprising a plurality of mask regions on a substrate, wherein exposed portions of the substrate are disposed between the mask regions. A plurality of nanostructures are epitaxially grown on the exposed portions of the substrate and over the mask regions, the plurality of nanostructures comprising a core tip. An active layer is epitaxially grown over the plurality of nanostructures, the active layer being a quantum well structure and comprising at least one material chosen from AlN, AlGaN and GaN. A p-doped layer is deposited over the active layer, both the active layer and the p-doped layer being conformal to the plurality of nanostructures so as to form an emitter tip over the core tip.

The present disclosure is also directed to a method of sanitizing a surface. The method comprises contacting the surface with UVC radiation emitted from a light emitting device. The device comprises a substrate and a patterned layer. The patterned layer comprises a plurality of mask regions on the substrate. Exposed portions of the substrate are disposed between the mask regions. A plurality of nanostructures are disposed on the exposed portions of the substrate and over the mask regions, the plurality of nanostructures being a single crystal semiconductor and comprising a core tip. An active layer is disposed over the plurality of nanostructures. The active layer is a quantum well structure and comprises at least one material chosen from AlN, AlGaN and GaN. A p-doped layer is disposed over the active layer. Both the active layer and the p-doped layer are conformal to the plurality of nanostructures so as to form an emitter tip over the core tip.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates aspects of the present teachings and together with the description, serve to explain the principles of the present teachings.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

An issue with LED's emitting radiation having wavelengths in the UVC range, and in particular in the 200 nm to 300 nm range, is low power (e.g., 10 microwatts or less, although what is considered low power may vary widely with the size of the device), or low overall external quantum efficiency (e.g., low quantum efficiency can be in the range of 10% or less). The origin of the low efficiency output includes, but is not limited to: 1) non-radiative recombination centers due to defects in active layer growth, 2) weak dipole moment due to a built-in crystal electric field, and 3) transverse-magnetic mode polarized emission (electric field oscillates perpendicular to the top surface), which decreases photon collection efficiency. The present disclosure addresses these three main issues via selective area epitaxial growth of an active layer (e.g. AlGaN quantum wells) on n+ doped nanostructures.

Selective area epitaxial growth refers to growing on a pre-patterned wafer where the growth can only occur in areas defined a-priori via a mask. As will be discussed in greater detail herein, selective area growth diverts defect propagation, provides a non-polar surface on which active regions (e.g. AlGaN quantum wells) can grow, thus reducing the built-in electric field that separates the wavefunction of carriers in the wells, and angles the transverse magnetic (TM) polarized emission to emit towards the apex of the triangular ridges, thereby improving the emission efficiency of light emitting devices.

Figure 1:
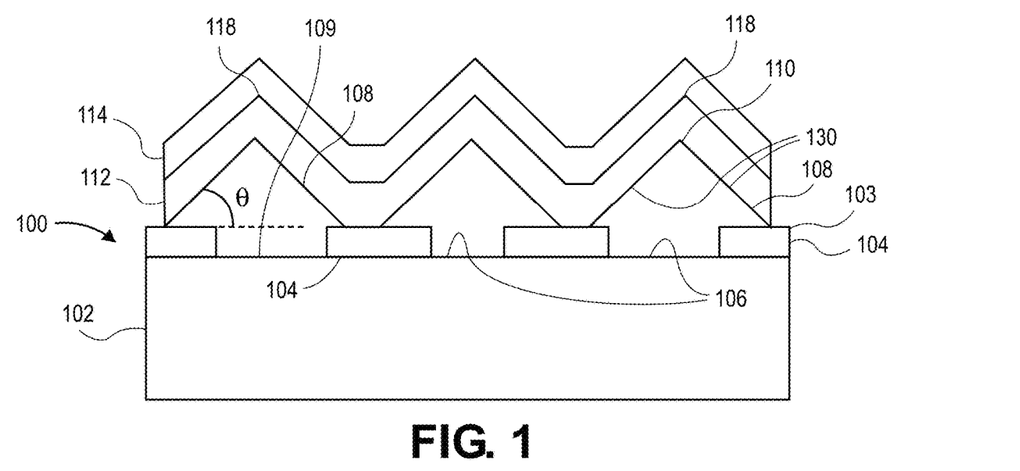
FIG. 1 is a schematic cross-sectional view of a light emitting device for emitting UVC radiation, according to an example of the present disclosure.

Referring to FIG. 1, the present disclosure is directed to a light emitting device 100 for emitting UVC radiation. The light emitting device 100 comprises a substrate 102. A patterned layer 103 comprising a plurality of mask regions 104 is disposed on the substrate 102. Exposed portions 106 of the substrate 102 are disposed between the mask regions 104. A plurality of nanostructures 108 are disposed on the exposed portions 106 of the substrate 102 and over the mask regions 104. The plurality of nanostructures 108 comprise a single crystal semiconductor and optionally include a core tip 110. The core tip 110, as well as the subsequently formed emitter tip, may be sharp (e.g., no c-axis material at the tip) or truncated (e.g., a small amount of c-axis material at the tip as shown at 132 in FIG. 7). An active layer 112 comprising at least one material chosen from AlN, AlGaN and GaN is disposed over the plurality of nanostructures 108. A p-doped layer 114 is disposed over the active layer 112, both the active layer and the p-doped layer being conformal to the plurality of nanostructures so as to form an emitter tip 118 over the core tip 110. There are benefits of growing the active layer 112 on the sloped sidewalls of the plurality of nanostructures 108, as described in detail below.

The substrate 102 comprises at least one material chosen from an insulator, a semiconductor material and combinations thereof. Example materials include silicon, silicon carbide (SiC), sapphire ($Al_2O_3$), gallium nitride (GaN), and Aluminum Nitride (AlN). Silicon provides an advantage in that it will act as a reflector for the UV light to be emitted, thereby potentially improving the efficiency of the light emitting device 100. Any other substrate materials suitable for growth of the plurality of nanostructures 108 can also be employed. As an example, the substrate can include a single crystal material for the uppermost surface that has crystal orientation of (0001) for SiC, $Al_2O_3$, GaN and AlN, and (111) for silicon. In an example, the substrate is n-type, and may include one or more n-type dopants that provide a suitable supply of electrons to the active layer, as is well known in the art. Alternatively, the substrate can be an insulating material and the electrons can be supplied by planar injection, as is also well known in the art. Optionally, the substrate can be removed and replaced with a second substrate, such as a flexible substrate, insulating substrate or any other desired type of substrate. Techniques for removing and replacing the substrate are well known in the art.

The mask regions 104 comprise at least one material chosen from an insulator, metal or other material that will allow for growth of the plurality of nanostructures 108. For example, source materials used for the epitaxial growth of the nanostructures may not have a tendency to stick to the chosen mask materials, but instead, stick to the exposed portions 106 of substrate 102 to grow the nanostructures. In addition, the mask material should be capable of surviving the temperatures used for subsequent processing and have the ability to be patterned on the substrate 102. As examples, the mask regions 104 can comprise at least one material chosen from silicon oxide (e.g., $SiO_2$), SiN, Ti and TiW. Any other suitable mask materials may be used.

The mask regions 104 have dimensions that allow the mask regions 104 to be completely covered by the plurality of nanostructures 108. For example, the mask regions have a width ranging from about 50 nm to about 1000 nm. The exposed portions 106 between the mask regions 104 have dimensions that are suitable for providing a desired dimensions of the plurality of nanostructures 108. As an example, the exposed portions 106 have a width ranging from about 50 nm to about 1000 nm. The plurality of nanostructures 108 grown from exposed portions 106 having such dimensions can be sufficiently narrow so that photons can more easily escape therefrom compared with much wider structures.

The plurality of nanostructures 108 comprise a single crystal material that provides a suitable surface for growth of the active layer 112 and can be epitaxially grown. Examples include at least one material chosen from AlN, GaN and AlGaN. The materials can have a hexagonal, dose packed crystal orientation. The nanostructures 108 can be n-doped so as to supply electrons to the active layer.

Figure 2:
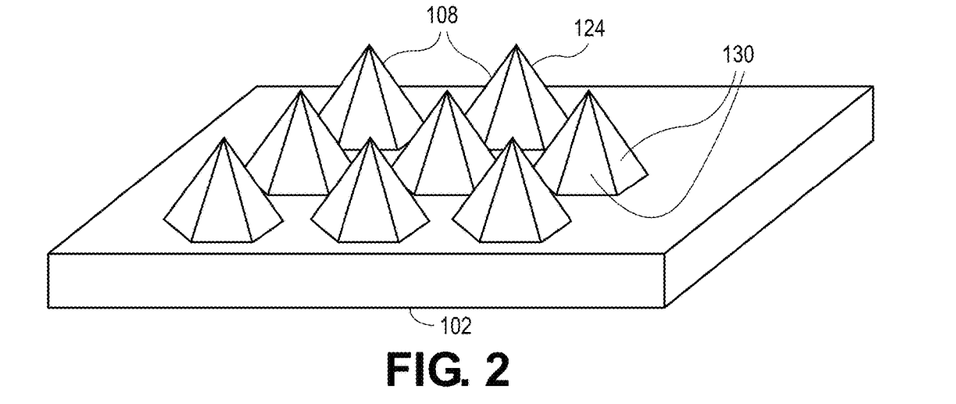
FIG. 2 illustrates a perspective view of a plurality of nanostructures, in the form of hexagonal pyramids, that can be employed for manufacturing light emitting devices, according to an example of the present disclosure.
Figure 3:
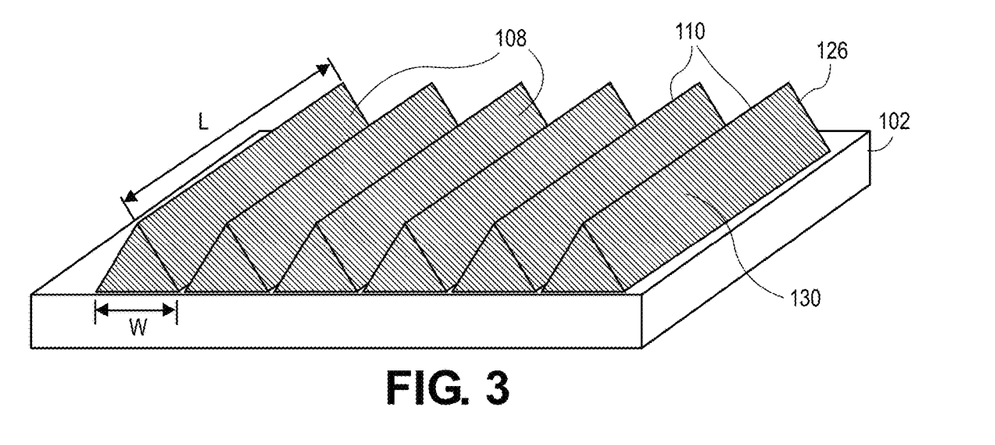
FIG. 3 illustrates a perspective view of a plurality of nanostructures, in the form of corrugated ridges, that can be employed for manufacturing light emitting devices, according to an example of the present disclosure.
Figure 4:
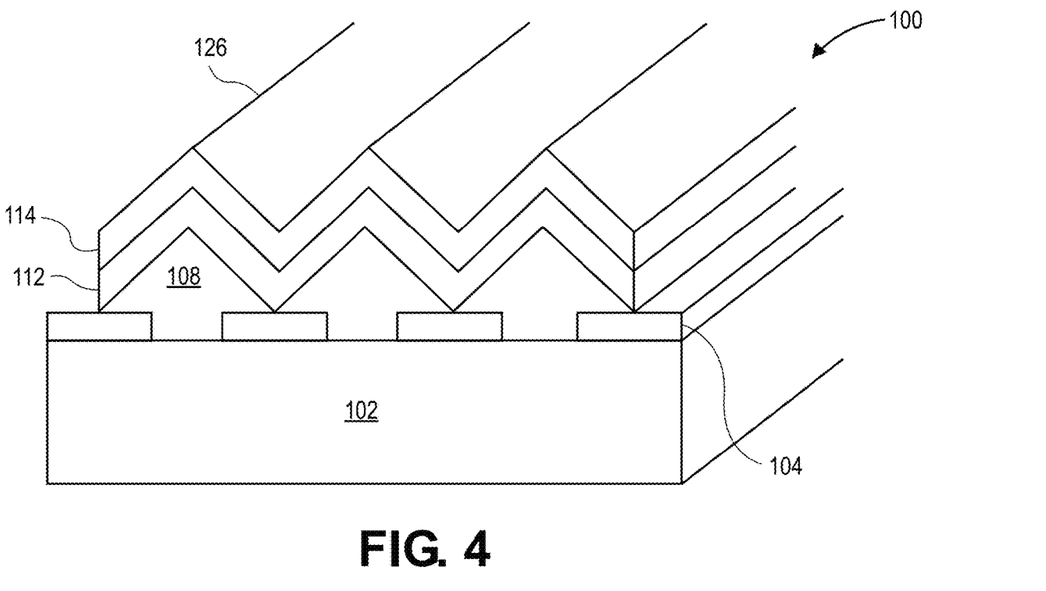
FIG. 4 illustrates a schematic view of a light emitting device having corrugated ridges that can be used for emitting UVC radiation, according to an example of the present disclosure.
Figure 5:
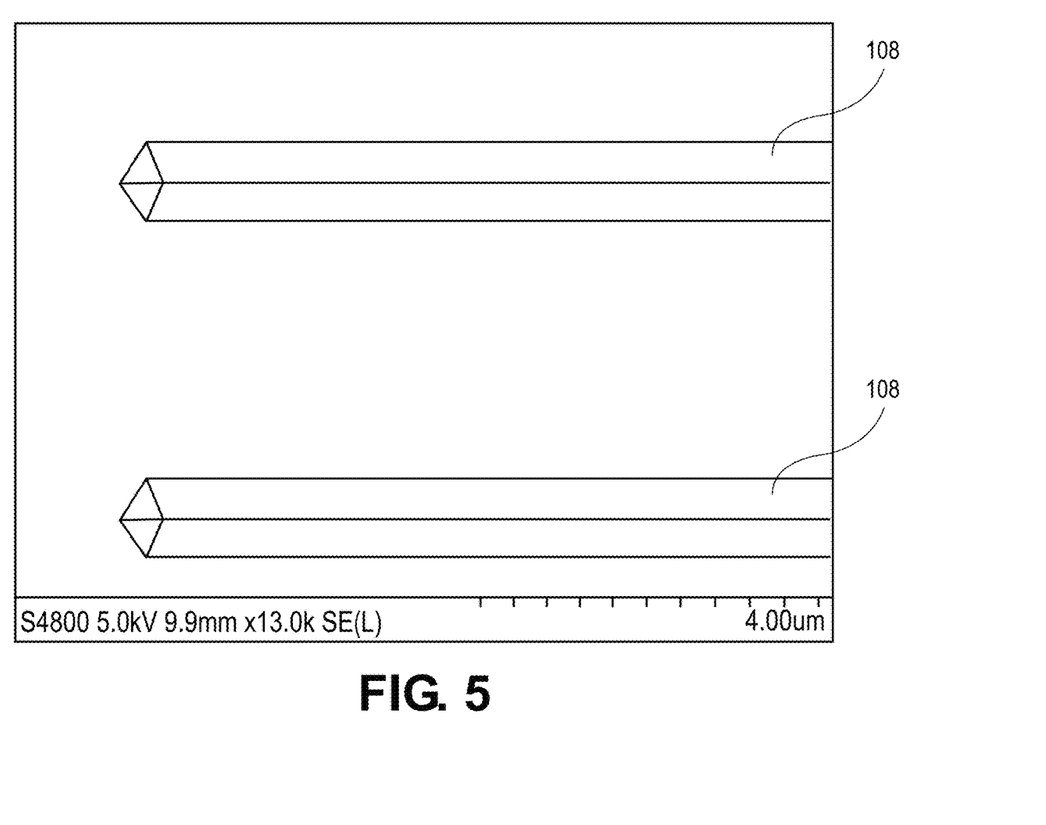
FIG. 5 illustrates an image taken by scanning electron microscopy of a top-down view of two parallel corrugated ridges, according to an example of the present disclosure.
Figure 6:
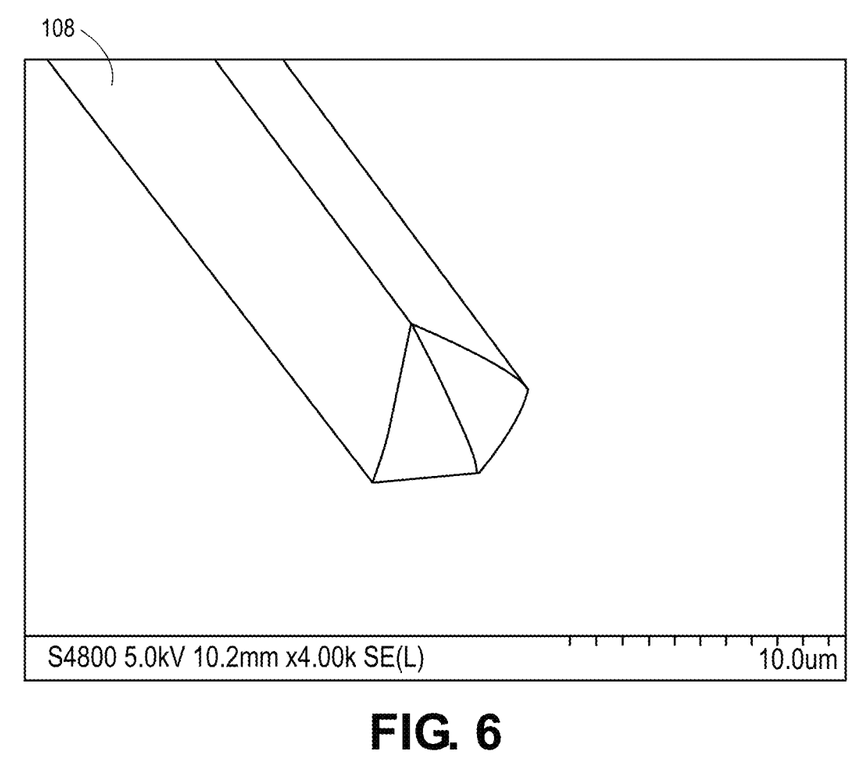
FIG. 6 illustrates an image taken by scanning electron microscopy of a top-down angled view of a single corrugated ridge, according to an example of the present disclosure.
Figure 7:
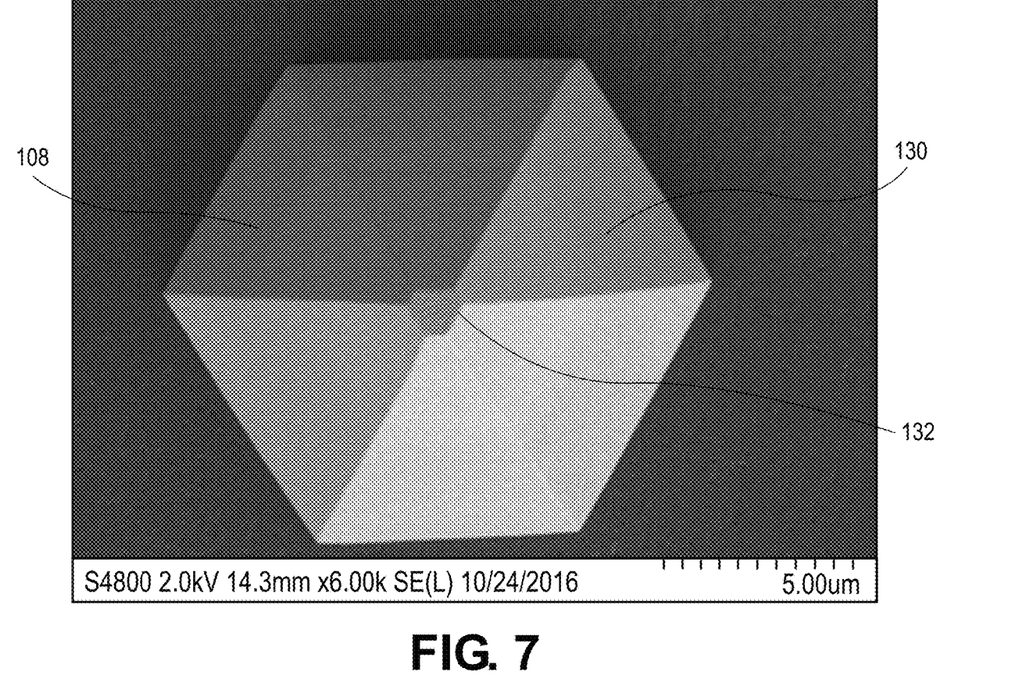
FIG. 7 shows an image taken by scanning electron microscopy of a top-down view of a GaN hexagonal prism, according to an example of the present disclosure.
Figure 8:
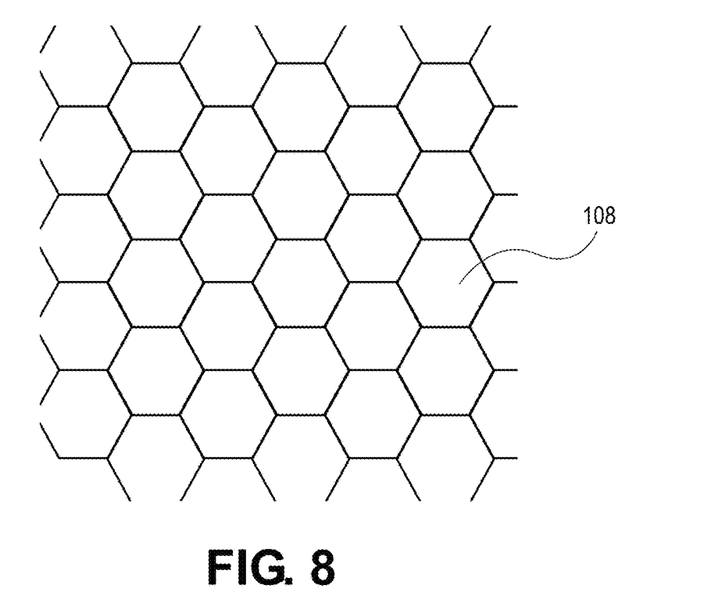
FIG. 8 is a schematic, top down view of a layout for hexagonal pyramids, arranged in a hexagonal grid array (e.g., honeycomb pattern), according to an example of the present disclosure.

The plurality of nanostructures 108 have a three-dimensional shape chosen from, for example, prisms, nanowires, fins and mesas (e.g., hexagonal mesas or other shaped mesas 124, as shown in FIG. 2). In another example, as illustrated in FIG. 3, the plurality of nanostructures 108 are ridges 126, which are corrugated, having a length to width ratio (L:W) of greater than 3:1, such as from about 5:1 to about 100,000:1 or more. FIG. 4 illustrates a perspective view of one example of the device of FIG. 1, which includes the ridges 126, which are corrugated. The ridges 126 can have a core tip 110, such as in the case of the triangular cross-section illustrated in FIG. 3. The plurality of nanostructures 108 may be touching or separated. FIG. 3 shows an example of a plurality of nanostructures 108 in the form of triangular ridges that are touching, while FIG. 2 shows hexagonal pyramids that do not touch. Also see FIGS. 5 and 6, which shows scanning electron microscopy of top-down views of two parallel triangular GaN ridges (FIG. 5) and a single triangular ridge (FIG. 6). Other materials can be employed instead of, or in addition to, GaN, such as AlN or AlGaN. The ridges of FIGS. 5 and 6 were grown through a mask and are not touching. FIG. 7 shows scanning electron microscopy of a top-down view of GaN hexagonal prism, but which could also comprise AlN or AlGaN. FIG. 8 shows a top down view of a schematic layout of how hexagonal pyramids, such as those of FIG. 7, could be arranged in a hexagonal grid array (honeycomb pattern), to increase fill factor.

The angled faces of the plurality of nanostructures 108 can provide a relatively large emission area and more easily allow photons to escape from the subsequently grown active layer 112 than would an active layer grown having a surface that is parallel to that of the substrate 102 (e.g., a c-axis surface). Techniques for epitaxially growing nanostructures having three-dimensional shapes with suitable angled faces are well known in the art. Three-dimensional shapes having a tip, or apex, can avoid relatively large amounts of c-axis material at the surface, which can allow for improved photon emission compared with the c-axis material alone. In an example, the ratio of non-c-axis surface area to c-axis surface area for the three-dimensional shape is at least 5, such as from about 10 to about 1000.

Referring again to FIG. 1, any of the plurality of nanostructures 108 described herein can comprise at least one face having an angle, ⊖, ranging from about 40 to about 90 degrees with respect to an upper surface 109 of the substrate (e.g., the c-axis surface of the substrate), such as about 43 to about 75, or about 55 degrees to about 65, or angles of about 57 or about 62. In an example, all of the upper faces 130 of the plurality of nanostructures 108, except for any c-axis face 132, as shown for example in FIG. 8, will have an angle, ⊖, within the ranges described herein. In some cases, the exact angles will depend upon the angles naturally formed by the material used at the growth conditions employed during epitaxy.

The dimensions of the mask regions 104 and the epitaxial growth conditions, such as gas flow rates and growth temperature, control the geometry of the plurality of nanostructures 108. One of ordinary skill in the art would be able to determine appropriate dimensions for the mask regions 104 and epitaxial growth conditions to provide the desired three-dimensional shapes for the plurality of nanostructures 108.

The plurality of nanostructures 108 provide advantages for UVC emitting devices. AlGaN and its alloys are difficult to grow using selective area masks that are based on dielectrics, since the aluminum atomic or metalorganic precursor has a tendency to stick to dielectric masks, and thus not selectively grow at the exposed portions 106. The nanostructures 108 are grown to cover the mask regions 104, so that the AlGaN precursors are not exposed to any mask regions 104. In order to accomplish complete coverage of the mask regions 104, the mask regions 104 are chosen to be relatively small in width, as described herein, so that the dielectric is covered fully as the lateral growth rate is usually slow.

The active layer 112 is a quantum well structure comprising a suitable material for emitting UVC radiation, such as AlN, AlGaN or GaN. The AlN, AlGaN and GaN can have a hexagonal crystal orientation (e.g., hexagonal close-packed orientation). The quantum well structure of the active layer 112 can be a single quantum well or a multiple quantum well structure. In an example, the active layer 112 comprises at least one AlN layer and at least one AlGaN layer, such as a three layer stack of AlN/AlGaN/AlN to form a quantum well. As another example, multiple stacks of AlGaN/AlN can be grown to form a multiple quantum well structure. In another example, the active layer 112 comprises at least one AlN layer and at least one GaN layer, such as a three layer stack of AlN/GaN/AlN. As another example, multiple stacks of GaN/AlN can be grown to form a multiple quantum well structure.

The thickness of the active layer 112 and the aluminum concentration therein determine emission wavelength. In an example, the active layer has a thickness ranging from about 1 nm to about 2000 nm, such as about 10 nm to 500 nm. In an example, the active layer comprises at least 50 mol %, such as about 60 mol % to about 80 mol % of aluminum. Thus, the active layer can comprise an $Al_xGa_{(1-x)}N$ material, where x ranges from 0.5 to about 0.9, such as about 0.6 to about 0.8. or about 0.65 to about 0.8. In an example, the active layer does not include indium (In).

The p-doped layer 114 comprises at least one p-doped semiconductor material suitable for supplying holes to the active layer 112. As an example, the p-doped layer 114 comprises at least one of semiconductor material chosen from AlN, AlGaN and hexagonal Boron Nitride. The p-doped layer can be deposited in any suitable manner, such as by employing epitaxial growth or chemical vapor deposition methods, as examples.

In an example, the p-type dopant of the p-doped layer 114 is graded or polarization doped. Grading and polarization doping are known techniques for increasing the concentration of holes, which may, among other things, reduce the threshold turn on voltage. Thus, in an example, a method of making a p-doped layer comprising a p-type dopant includes introducing the p-type dopant by a polarization doping technique. In an example, the p-doped layer is has a graded dopant concentration.

The completed light emitting device 100 comprises one or more light emitting diodes. The one or more light emitting diodes are configured to emit radiation having a wavelength in the UVC range, such as from about 200 nm to about 350 nm, or about 200 nm to about 300 nm, or about 200 nm to less than 250 nm.

Growing the active layer 112 on the plurality of nanostructures 108 has several benefits for UVC emitting devices. First, the growth of the nanostructures on the mask regions 104 can reduce defects in the active layer 112. Selective area growth is generally known to terminate defect propagation, thus resulting in a higher quality surface for the epitaxial growth of active layer 112. Selective area growth is in contrast to other nanoscale etch-based designs, which generally increase material defects.

A benefit of growing the active layer 112 on the sloped sidewalls of the plurality of nanostructures 108 is that doing so can provide for improved photon emission efficiency for UVC emitting devices. This is because short wavelength (UVC) LEDs employ high Al-content AlGaN quantum wells. For a $Al_xGa_{1-x}N$ quantum-well, where x>65 mol % and having a c-plane normal axis, light emission is dominated by transverse magnetic (TM) polarized emission. TM polarized light propagates within the plane of the quantum well, and undesirably can be absorbed within the material or cladding layers before the light is extracted at the surface. In contrast, transverse electric (TE) polarized light propagates normal to the quantum well, and yields higher extraction efficiencies. By growing the quantum wells on the angled faces of the selective-area grown ridges of the plurality of nanostructures 108, and if the face dimensions are kept small enough to reduce or minimize absorption, the emission can come out at the apex of the ridges at, for example, a 62 degree angle or higher. The emission angle is determined by, among other things, the resulting sloped sidewalls of the active layer 112 (e.g., the AlGaN/AlN quantum well stack ridges of the active layer 112). The side face can be a (10-11) face that is 62 degrees to the c-plane. Non-equilibrium conditions can change the angle of the face resulting in other faces such as (11-22) at 58 degrees.

In addition, growing the active layer 112 on the plurality of nanostructures 108 can provide increased oscillator strength. Most nitride-based optically active materials, such as GaN or AlGaN, have a large built in electric field along the (0001) c-axis, and are typically grown mostly in this direction. Thus, the resulting dipoles in the material will have a weak oscillator strength due to electron/hole wavefunction separation caused by this electric field (e.g., the electrons and holes are pulled apart by the strong dipole forces and this reduces their ability to recombine and emit light). Growing the active layer 112 on the faces of sloped ridges addresses this issue by utilizing faces with reduced or no electric field compared to the dipole of the c-axis. The faces of the ridges can be semi polar (10-11) or non-polar (11-20) instead of the (0001 c-axis) polar plane, leading to better wavefunction overlap between electron and holes and therefore increasing the recombination rate. The result is a higher internal efficiency.

The present disclosure is also directed to a method of making a light emitting device 100 for emitting UVC radiation. The method comprises forming a patterned layer 103 comprising a plurality of mask regions 104 on a substrate 102. Exposed portions 106 of the substrate 102 are formed between the mask regions 104. To make the selective area mask on the substrate, a dielectric layer or metal layer, as disclosed herein, is deposited onto the surface of the substrate 102. The mask is then patterned by, for example, standard optical lithographic techniques.

A plurality of nanostructures are epitaxially grown on the exposed portions 106 of the substrate 102 and over the mask regions 104. The plurality of nanostructures 108 comprise a core tip 110. This process can include, for example, loading the substrate 102 patterned with mask regions 104 into a growth chamber, such as an MOCVD or MBE chamber. Under appropriate growth conditions the plurality of nanostructures 108 will selectively grow on the exposed portions 106 between the plurality of mask regions 104. The growth can be in the shape of, for example, sloped (e.g., triangular or pyramidal) ridges or any of the other shapes as described herein for the nanostructures. The c-plane is the fastest growing plane. When by the growth of the sloped ridges the c-plane is extinguished, the sloped sidewalls will then grow laterally over the mask regions 104. Once two neighboring sloped ridges join over the mask regions 104, the growth process is ended.

An active layer 112 is epitaxially grown over the sloped ridges of the plurality of nanostructures 108. The active layer 112 comprises at least one material chosen from AlGaN, AlN and GaN disposed over the plurality of nanostructures. A p-doped layer 114 is deposited over the active layer 112 by any suitable deposition methods, such as epitaxial growth or chemical vapor deposition. Both the active layer 112 and the p-doped layer 114 are conformal to the plurality of nanostructures so as to form an emitter tip 118 over the core tip 110.

The present disclosure is also directed to a method of sanitizing a surface. The method comprises contacting the surface with UVC radiation emitted from any of the light emitting devices disclosed herein. As an example, the light emitting device 100 comprises a substrate 102. A patterned layer 103 comprises a plurality of mask regions 104 on the substrate. Exposed portions 106 of the substrate 102 are disposed between the mask regions 104. A plurality of nanostructures 108 are disposed on the exposed portions 106 of the substrate 102 and over the mask regions 104. The plurality of nanostructures 108 are a single crystal semiconductor and comprise a core tip 110. An active layer 112 comprise at least one material chosen from AlGaN, AlN and GaN disposed over the plurality of nanostructures 108. A p-doped layer 114 is disposed over the active layer. Both the active layer 112 and the p-doped layer 114 are conformal to the plurality of nanostructures 108 so as to form an emitter tip 118 over the core tip 110.

An efficient UVC emitter in the 200-350 nm, 200-300 nm or 200 to less than 250 nm range would benefit UV-based sanitation generally. Targeting specific wavelengths in these ranges would allow for a compact energy efficient method of sanitization, as well as potentially being eye and skin safe for human exposure. There is significant commercial interest in producing a highly efficient UV source. The UVC LED devices of the present disclosure would provide the desired efficiency and would have a broad array of commercial applications in addition to sanitization/sterilization, such as, for example: 1) lasers for cooling of trapped ions, for example Mg ions use 279 nm and Hg+ ions use 281 nm lasers, for compact atomic clocks or more compact quantum memories; 2) micro raman light sources, because raman intensity is proportional to the wavelength, and thus a short wavelength source can obtain orders of magnitude more signal than a long wavelength source; and 3) lighting and display applications, such as a compact and efficient excitation source for phosphorescent materials. Still other applications can be recognized by one of ordinary skill in the art.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" is defined to mean within plus or minus 10% of the value listed, as long as the alteration does not result in nonconformance of the process or structure to the intended purpose described herein. Moreover, all ranges disclosed herein are to be understood to encompass any and all sub-ranges subsumed therein.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A light emitting device for emitting UVC radiation, comprising:
    a substrate;
    a patterned layer comprising a plurality of mask regions on the substrate, exposed portions of the substrate being disposed between the mask regions;
    a plurality of nanostructures disposed on the exposed portions of the substrate and over the mask regions, the plurality of nanostructures being a single crystal semiconductor and comprising angled faces, a c-axis surface parallel to that of the substrate, and a core tip;
    an active layer disposed over the angled faces of the plurality of nanostructures, the active layer being a quantum well structure and comprising at least one material chosen from AlN, AlGaN and GaN, the active layer configured to emit UVC radiation during operating of the light emitting device; and
    a p-doped layer disposed over the active layer, both the active layer and the p-doped layer being conformal to the plurality of nanostructures so as to form an emitter tip over the core tip.

2. The light emitting device of claim 1, wherein the substrate comprises at least one semiconductor chosen from silicon, sapphire ($Al_2O_3$), silicon carbide (SiC), gallium nitride (GaN) and Aluminum Nitride (AlN).

3. The light emitting device of claim 1, wherein the mask regions comprise at least one material chosen from an insulator and a metal.

4. The light emitting device of claim 1, wherein the mask regions have a width ranging from about 50 nm to about 1000 nm.

5. The light emitting device of claim 1, wherein the exposed portions between the mask regions have a width ranging from about 50 nm to about 1000 nm.

6. The light emitting device of claim 1, wherein the plurality of nanostructures comprise at least one material chosen from AlN, GaN and AlGaN, the material of the plurality of nanostructures being different than the material of the active layer.

7. The light emitting device of claim 1, wherein the nanostructures have a three-dimensional shape chosen from prisms, nanowires and mesas.

8. The light emitting device of claim 1, wherein the nanostructures are ridges that are corrugated.

9. The light emitting device of claim 1, wherein the nanostructures are hexagonal mesas.

10. The light emitting device of claim 1, wherein nanostructures comprise at least one face having an angle ranging from about 40 degrees to about 90 degrees with respect to an upper surface of the substrate on which they are formed.

11. The light emitting device of claim 1, wherein the active layer is a multiple quantum well structure comprising at least one AlN layer and at least one AlGaN layer.

12. The light emitting device of claim 1, wherein the active layer comprises $Al_xGa_{(1-x)}N$, where x ranges from 0.5 to about 0.9.

13. The light emitting device of claim 1, wherein the active layer has a thickness ranging from about 1 nm to about 2000 nm.

14. The light emitting device of claim 1, wherein the light emitting device comprises one or more light emitting diodes, the one or more light emitting diodes being configured to emit radiation having a wavelength ranging from about 200 nm to about 350 nm.

15. The light emitting device of claim 1, wherein the p-doped layer comprises at least one semiconductor material chosen from AlN, AlGaN and hexagonal Boron Nitride, the material of the p-doped layer being different than the material of the active layer.

16. The light emitting device of claim 1, wherein the p-doped layer has a graded dopant concentration.

17. The light emitting device of claim 1, wherein the substrate is a flexible substrate.

18. The light emitting device of claim 1, wherein the active layer does not include indium.

19. A method of making a UVC light emitting device, the method comprising:
    forming a patterned layer comprising a plurality of mask regions on a substrate, wherein exposed portions of the substrate are disposed between the mask regions;
    epitaxially growing a plurality of nanostructures on the exposed portions of the substrate and over the mask regions, the plurality of nanostructures comprising angled faces, a c-axis surface parallel to that of the substrate, and a core tip;
    epitaxially growing an active layer over the angled faces of the plurality of nanostructures, the active layer being a quantum well structure and comprising at least one material chosen from AlN, AlGaN and GaN, the active layer configured to emit UVC radiation during operating of the light emitting device; and
    depositing a p-doped layer over the active layer, both the active layer and the p-doped layer being conformal to the plurality of nanostructures so as to form an emitter tip over the core tip.

20. The method of claim 19, wherein the substrate comprises at least one semiconductor chosen from silicon, silicon carbide (SiC), sapphire($Al_2O_3$), gallium nitride (GaN) and Aluminum Nitride (AlN).

21. The method of claim 19, wherein the mask regions comprise at least one material chosen from an insulator and a metal.

22. The method of claim 19, wherein the plurality of nanostructures comprise at least one material chosen from AlN, GaN and AlGaN, the material of the plurality of nanostructures being different than the material of the active layer.

23. The method of claim 19, wherein the nanostructures have a three-dimensional shape chosen from prisms, nanowires and mesas.

24. The method of claim 19, wherein the nanostructures are ridges that are corrugated.

25. The method of claim 19, wherein nanostructures comprise at least one face having an angle ranging from about 40 degrees to about 90 degrees with respect to an upper surface of the substrate on which they are formed.

26. The method of claim 19, wherein the active layer comprises $Al_xGa_{(1-x)}N$, where x ranges from 0.5 to about 0.9.

27. The method of claim 19, wherein the active layer has a thickness ranging from about 1 nm to about 2000 nm.

28. The method of claim 19, wherein the p-doped layer comprises a p-type dopant, the method further comprising introducing the p-type dopant by a polarization doping technique.

29. The method of claim 19, further comprising removing the substrate and replacing it with a second substrate.

30. The method of making a UVC light emitting device of claim 19, wherein the active layer does not include indium.

31. A method of sanitizing a surface, the method comprising:
- contacting the surface with UVC radiation emitted from a light emitting device, the light emitting device comprising:
  - a substrate;
  - a patterned layer comprising a plurality of mask regions on the substrate, exposed portions of the substrate being disposed between the mask regions;
  - a plurality of nanostructures disposed on the exposed portions of the substrate and over the mask regions, the plurality of nanostructures being a single crystal semiconductor and comprising angled faces, a c-axis surface parallel to that of the substrate, and a core tip;
  - an active layer disposed over the angled faces of the plurality of nanostructures, the active layer being a quantum well structure and comprising at least one material chosen from AlN, AlGaN and GaN, the active layer configured to emit UVC radiation during operating of the light emitting device; and
  - a p-doped layer disposed over the active layer, both the active layer and the p-doped layer being conformal to the plurality of nanostructures so as to form an emitter tip over the core tip.

32. The method of claim 31, wherein the UVC radiation has a wavelength ranging from about 200 nm to about 300 nm.

33. The method of claim 31, wherein the UVC radiation has a wavelength ranging from about 200 nm to less than 250 nm.

34. The method of sanitizing a surface of claim 31, wherein the active layer does not include indium.

* * * * *